United States Patent [19]

Min et al.

[11] Patent Number: 5,402,378
[45] Date of Patent: Mar. 28, 1995

[54] CIRCUIT FOR GENERATING A CLOCK SIGNAL TO SEPARATE BIT LINES IN A SEMICONDUCTOR MEMORY DEVICE

[75] Inventors: Kyung-Youl Min; Yong-Sik Seok, both of Kyungi-do, Rep. of Korea

[73] Assignee: SamSung Electronics Co., Ltd., Kyungki-do, Rep. of Korea

[21] Appl. No.: 972,522

[22] Filed: Nov. 6, 1992

[30] Foreign Application Priority Data

Feb. 19, 1992 [KR] Rep. of Korea .................. 1992-2486

[51] Int. Cl.$^6$ ................................................ G11C 7/00
[52] U.S. Cl. .................................. 365/202; 365/196; 365/203
[58] Field of Search ................. 365/203, 202, 184, 196, 365/233

[56] References Cited

U.S. PATENT DOCUMENTS

| | | | |
|---|---|---|---|
| 4,608,670 | 8/1986 | Duvvury et al. | 365/205 |
| 4,791,616 | 12/1988 | Taguchi et al. | 365/205 |
| 4,951,256 | 8/1990 | Tobita | 365/210 X |
| 5,020,031 | 5/1991 | Miyatake | 365/203 |
| 5,023,841 | 6/1991 | Akrout et al. | 365/205 |
| 5,091,885 | 2/1992 | Ohsawa | 365/203 |
| 5,177,708 | 1/1993 | Furutani et al. | 365/203 |
| 5,189,639 | 2/1993 | Miyatake | 365/203 X |

OTHER PUBLICATIONS

Mosaid Design, "An Analysis of the Hitachi HM511000 1Mx1 CMOS DRAMs", Mar. 1988, p. 58.

*Primary Examiner*—Do Hyun Yoo
*Attorney, Agent, or Firm*—Robert E. Bushnell

[57] ABSTRACT

A semiconductor memory device using a low level supply voltage has separation gates for isolating adjacent bit lines. The device may be constructed with a circuit for receiving a high voltage supplied by a high voltage generator resident upon the chip so as to provide the separation gates with a voltage increased at least by the amount of the threshold voltage of the separation gates over the supply voltage.

22 Claims, 3 Drawing Sheets

CIRCUIT FOR GENERATING A CLOCK SIGNAL TO SEPARATE BIT LINES IN A SEMICONDUCTOR MEMORY DEVICE

FIELD OF THE INVENTION

The present invention relates to a semiconductor memory device, and more particularly, to a circuit for generating a clock signal for separate bit lines in a semiconductor memory device with shared sense amplifiers.

BACKGROUND OF THE INVENTION

In contemporary semiconductor device design practice there is a continued effort to increase the density of elements contained within the device while reducing the amplitude of the power supply voltage, increasing operational speed, and maintaining stable operation.

Semiconductor memory devices having multiple memory cell arrays accessed by a single input/output gate can not store logic high data into individual memory cells at the supply voltage level because of voltage drops associated with isolation transistors. That is, when storing data bits at logic high states, the exact power supply voltage level can not be precisely provided to the individual memory cells because clock signals applied to the gates of the isolation transistors only have voltages equal to the power supply voltage.

Therefore, the voltage provided to the individual memory cell array is decreased by the threshold voltage of the corresponding isolation transistor. One solution to this problem has been to boost the amplitude of the clock signals to levels exceeding the power supply voltage by at least the threshold voltage of the isolation transistors. Conventional boosting circuits however, tend to be inadequate in newer semiconductor memory devices. These devices generally operate at lower power supply voltages, e.g., 3.3 to 5 volts, and even at 1.5 volts. Although these new devices are more integrated requiring smaller transistors with reduced channel sizes and correspondingly lower threshold voltages, the drastically lower operating voltages tend to outweigh the beneficial effect of the lower threshold voltages. Furthermore, the boosting circuits operate less effectively at the lower supply voltages. Therefore, the art of boosting circuits must be advanced before further integration of the semiconductor memory devices can be be achieved.

SUMMARY OF THE INVENTION

It is therefore an object of the present invention to provide a circuit for generating a clock signal to isolate bit lines in a highly integrated semiconductor memory device using a low level supply voltage.

It is another object to provide a highly integrated semiconductor memory device able to transfer high logic states of data for individual memory cells at the exact voltage of the supply voltage.

It is a further object to provide a circuit for transferring data at an effective data voltage when the data is written into the memory cells of a highly integrated memory.

These and other objects may be attained according to the principles of the present invention, with a semiconductor memory device using a low level supply voltage. Isolation transistors separate adjacent bit lines, and a circuit receiving a high voltage supplied by a high voltage generator within the chip provides the isolation transistors with a voltage exhibiting a level increased by at least an amount equal to the threshold voltage of the isolation transistor over the supply voltage.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like numbers indicate the same or similar components, wherein.

DETAILED DESCRIPTION OF THE DRAWINGS

Figure 1:
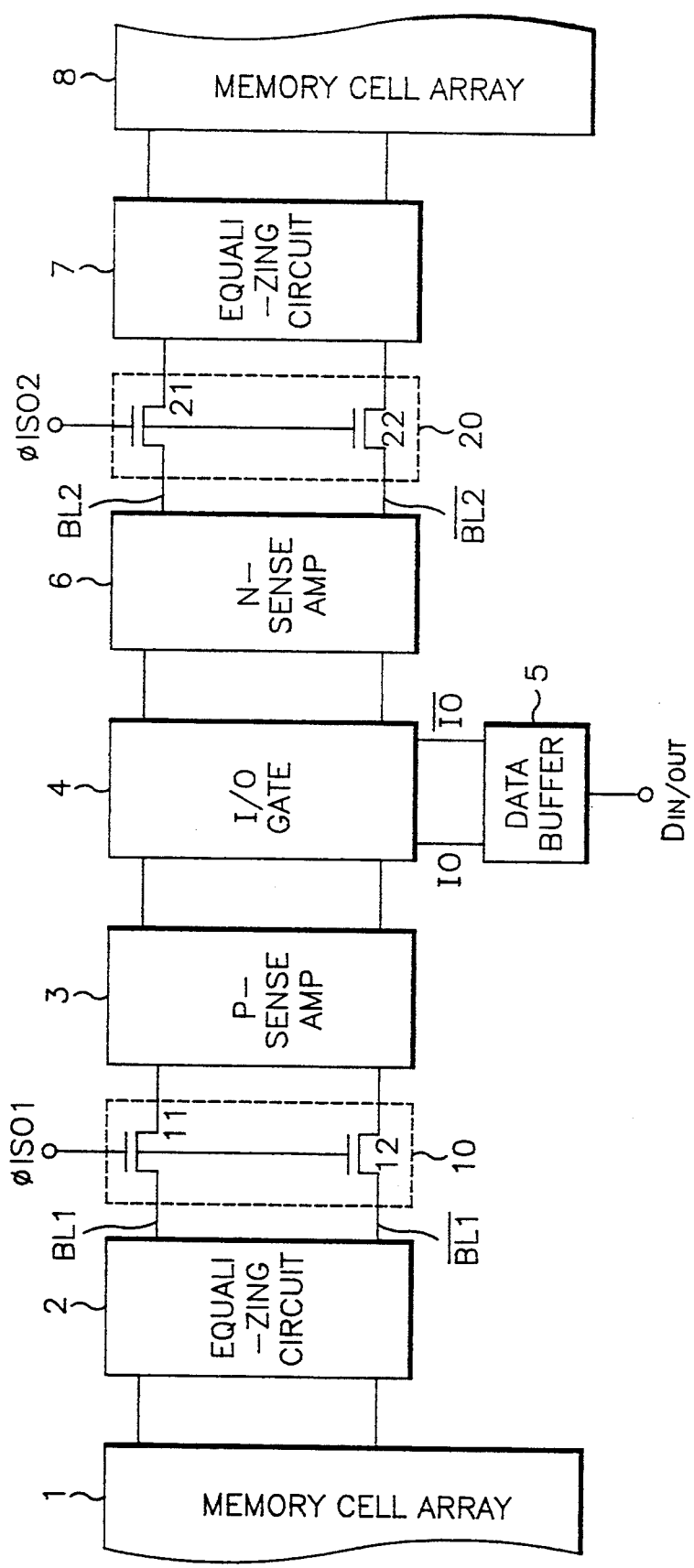
FIG. 1 is a block diagram illustrating an arrangement of sense amplifiers and their peripheral circuits in a semiconductor memory device.

Turning now to the drawings, FIG. 1 shows the structure of a known bit line-related circuit of a semiconductor memory device. This circuit comprises p-type and n-type sense amplifiers 3 and 6 shared by adjacent left and right memory cell arrays 1 and 8; and an input/output gate 4 coupled between the bit line pairs BL1, $\overline{BL1}$ and BL2, $\overline{BL2}$. To read or write data from an individual memory cell in the left memory cell array 1, the bit line pair BL2 and $\overline{BL2}$ connected with the right memory cell array 8 are isolated from the bit line pair BL1 and $\overline{BL1}$ connected with the selected left memory cell array 1. Isolation is accomplished by turning on the isolation transistors 11 and 12 of isolation stage 10 by generating a high logic state clock signal $\Phi$ISO1 while turning off isolation transistors 21 and 22 of isolation stage 20 by generating a low logic state clock signal $\Phi$ISO2, thereby achieving a selective sensing or writing operation. In contrast, to select a memory cell in the right memory cell array 8, the reverse of the preceding procedure may be followed.

During write operations, if the logic high level of the isolation clock signals $\Phi$ISO1, $\Phi$ISO2 for isolating the bit lines is equal to the power supply level Vcc, the level of the data stored in the selected memory cell may not be at the exact level of Vcc because of the voltage drop occurring across the channels of isolation transistors 11, 12, 21 and 22. Therefore, data bits exhibiting a logic high state cannot be stored into the selected memory cell at the exact level of Vcc, because the isolation clock signals $\Phi$ISO1 and $\Phi$ISO2 applied to the gates of the isolation transistors have only an amplitude equal to the voltage level of Vcc.

Figure 2:
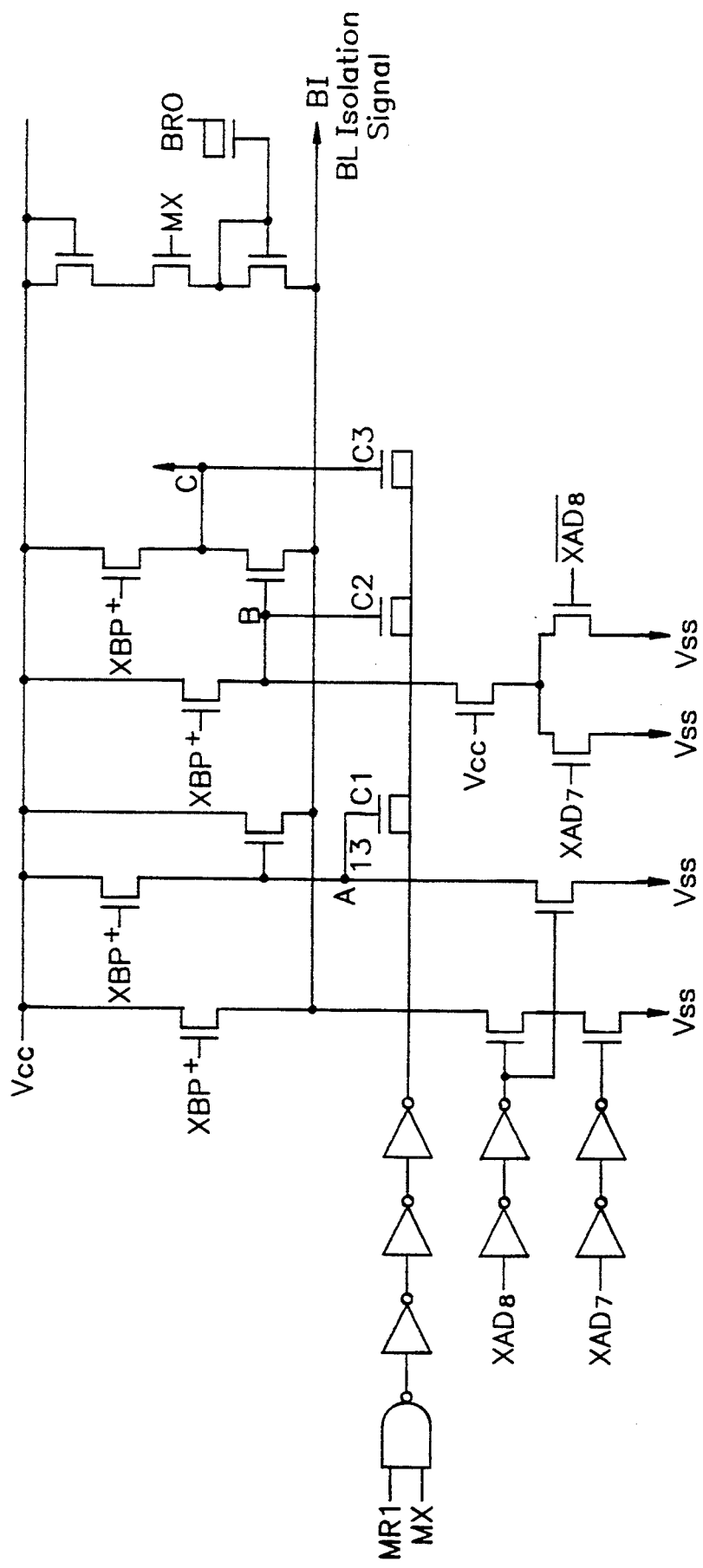
FIG. 2 is a conventional circuit for generating a clock signal for isolating bit lines in a semiconductor memory device.

In one effort to address the above-identified problem, Hitachi, Ltd. has proposed the bit line separation clock signal generator shown in FIG. 2. See *An Analysis of the Hitachi, Ltd. HM511000 1M×1 CMOS DRAMs*, printed in *MOSAID*, March 1988, page 58. Referring now to FIG. 2, an input address signal causes the amplitude of the voltage at nodes B and C to be self-boosted so that the output voltage level of the bit line separation clock signal BI exceeds Vcc, (i.e., Vcc+α). The value e is greater at least than the threshold voltage of the isolation transistors 11, 12, 21, and 22 shown in FIG. 1 so that the selected memory cells can be provided with the voltage of the exact Vcc amplitude. This bit line separation clock signal generator however, does not provide an adequate boost in highly integrated memory devices operating at the lower source voltages, and is therefore not suitable for use in devices constructed according to contemporary semiconductor device design practice.

Figure 3:
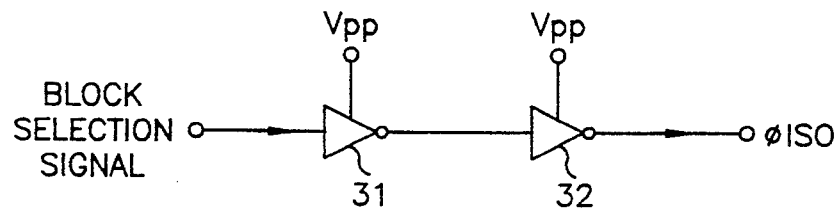
FIG. 3 is a circuit for generating a clock signal for isolating bit lines of a first embodiment constructed according to the principles of the present invention.

Turning now to FIG. 3 a schematic diagram illustrates a first embodiment of the present invention which endeavors to provide the selected memory cells with a voltage having an amplitude the same as that of the supply voltage $V_{cc}$, used in a highly integrated memory device operating at a lower source voltage, including a first inverter, or first driver, 31 for receiving a block selection signal and employing an externally applied high amplitude voltage Vpp as a control constant voltage source, and a second inverter, or second driver, 32 for receiving the output of the first inverter 31 and employing the high amplitude voltage Vpp as the control constant voltage source, to generate a clock signal ΦISO for isolating bit lines during a selective sensing operation.

A high voltage generator circuit for generating the high amplitude voltage Vpp is usually installed on the chip of conventional monolithic semiconductor dynamic random access memories, and therefore, that generator is not shown in the attached drawings. The high voltage generator, generates a voltage Vpp with an amplitude of approximately 2 Vcc, whereby Vcc is not greater than 33 volts, through charge pumping in response to the pumping clock signals from an oscillator. The high amplitude voltage Vpp may be generated by a circuit including an oscillator, a driver, a capacitor and an NMOS transfer transistor for transferring a voltage generated at the capacitor.

One circuit constructed as shown by FIG. 3 is provided for generating each of the isolation clock signals ΦISO1 and ΦISO2 of FIG. 1. In order to write data to the selected left memory cell array 1, the data transmission path should be isolated from the right memory cell array 8 by supplying a logic low isolation clock signal ΦISO2 to the right isolation stage 20. Meanwhile, a logic high isolation clock signal ΦISO1 is generated in response to a logic high block selection signal so that data with amplitude at the exact Vcc level is written into the cells of the memory cell array.

Figure 4:
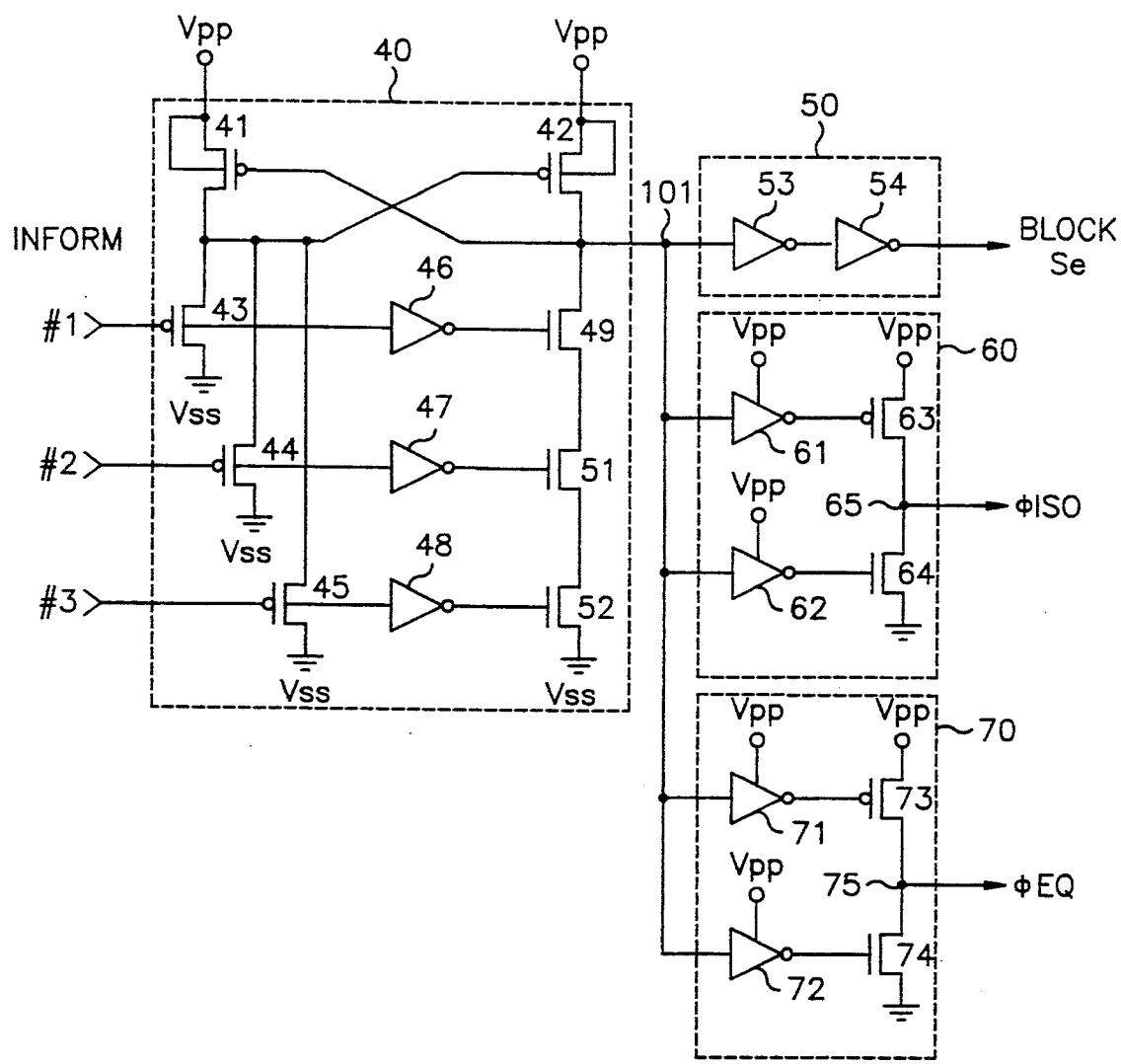
FIG. 4 is a circuit for generating a clock signal for isolating bit lines of a second embodiment constructed according to the principles of the present invention.

FIG. 4 illustrates a second embodiment of the present invention. This circuit generates a block selection signal, bit line isolation clock signal, and equalizing signal. The circuit comprises a high power voltage Vpp driver 40 for providing the high amplitude voltage Vpp in response to three address signals #1, #2 and #3, a block selection signal driver 50 for producing a block selection signal in response to the high amplitude voltage Vpp output at node 101 by driver 40, a bit line isolation clock driver 60 for producing the isolation clock signal ΦISO with the amplitude of Vpp to isolated bit lines in response to the output of Vpp driver 40. An equalizing signal driver 70 produces the equalizing signal ΦEQ in response to the output of Vpp driver 40. The equalizing signal ΦEQ is triggered before and after bit line sensing to enable equalizing circuits 2, 7 to set the selected bit lines with a voltage having an amplitude equal to that of the voltage source Vcc level. The left and right bit line isolation clock signals of FIG. 1 are generated at the Vpp level. If all the address signals are input at a logic "high" state, node 101 between Vpp driver 40 and block selection signal driver 50, bit line isolation clock driver 60, and equalization signal driver 70 is not connected with the ground reference voltage and is therefore, charged to the amplitude of the Vpp voltage by PMOS transistor 42 which is then in an electrically conducting ON state. Then, the isolation clock signal ΦISO is output by driver 60 with an amplitude at the Vpp level, and the equalizing signal ΦEQ generated by driver 70 is provided with an amplitude at the Vcc level.

In accordance with the second embodiment as shown in FIG. 4, the high power voltage $V_{pp}$ driver 40 for driving an externally applied high amplitude voltage $V_{pp}$ to an output node 101, is comprised of a first and second PMOS transistors 41, 42 each coupled to receive the high amplitude voltage $V_{pp}$ and having control electrodes connected to node A and 101 respectively; a third, fourth and fifth PMOS transistors 43, 44, 45 each having a channel electrode connected between node A and ground $V_{ss}$ and a control electrode coupled to receive each of the three address signals #1, #2, #3, respectively; a first, second and third serially-connected NMOS transistors 49, 51, 52 connected between the output node 101 and ground $V_{ss}$; and a first, second and third inverters 46, 47, 48 interposed between the control electrodes of the third, fourth and fifth PMOS transistors 43, 44, 45 and the first, second and third NMOS transistors 49, 51, 52.

The block selection signal driver 50 is comprised of a pair of serially-connected inverters 53, 54 coupled to receive the high amplitude voltage $V_{pp}$ in order to produce the block selection signal for enabling access to memory cells of the selected memory cell array 1 or 8. The bit line isolation clock driver 60 is comprised of a pair of PMOS and NMOS transistors 63, 64 serially-connected between a power terminal providing the high amplitude voltage $V_{pp}$ and ground $V_{ss}$ for producing the bit line isolation clock signals ΦISO1, and ΦISO2; and a pair of inverters 61, 62 interposed between the output node 101 and control electrodes of the PMOS transistor 63 and the NMOS transistor 64 and controlled by the externally applied high amplitude voltage $V_{pp}$, as a control constant voltage source. Similarly, the equalizing signal driver 10 is comprised of the same circuit elements as that of the bit line isolation clock driver 60. The equalizing signal driver 70 is however used to produce the equalizing signal ΦEQ for enabling the equalizing circuit 2 or 7 to equalize the bit line pair BL and $\overline{BL}$ with a same logic level in order to enable the sense amplifier 3 or 6 to sense the data transmitting through the bit lines BL and $\overline{BL}$.

As stated above, the embodiments of the circuits described in the foregoing paragraphs provide output signals raising the voltage level of the bit line isolation clock signal by using a high voltage produced by the high voltage generator resident on the chip so that data may be effectively written into the memory cells of a highly integrated memory device using an operating supply voltage. Additionally, the circuits described can equalize the bit line pairs before, as well as after, performance of a sensing operation.

We claim:

1. A semiconductor memory device, comprising:
   a power supply source for providing a first voltage;
   a memory cell array having a plurality of memory cells;

a pair of bit lines coupled to access selected memory cells of said memory cell array, for transferring data exhibiting an amplitude at a second voltage;

eating means comprising a pair of isolation transistors exhibiting a threshold voltage, for isolating the bit lines in response to a dock signal exhibiting said first voltage different from said second voltage by at least said threshold voltage, to enable the bit lines to transfer said data exhibiting the amplitude at said second voltage into the selected memory cells of said memory cell array; and clock signal generator means coupled to said first voltage, for generating said clock signal exhibiting said first voltage different from said second voltage by at least said threshold voltage to control operation of said eating means, said clock signal generator means comprising:

driver means for driving a predetermined voltage in response to address signals;

a first pair of serially-connected transistors disposed between a first terminal and a second terminal, for producing said clock signal; and a first pair of inverters each connected to said first terminal and coupled to receive said predetermined voltage, for controlling operation of said first paid of serially-connected transistors.

2. The semiconductor memory device as claimed in claim 1, further comprised of said second voltage being not greater than 3.3 volts.

3. The semiconductor memory device as claimed in claim 1, wherein said driver means comprises:

a first PMOS transistor having a principal electrically conducting channel disposed between said first terminal and a first node, and a control electrode connected to an output node for producing said clock signal;

a second PMOS transistor having a principal electrically conducting channel disposed between said first terminal and said output node, and a control electrode connected to said first node;

third, fourth and fifth PMOS transistors each having a principal electrically conducting channel disposed between said first node and said second terminal, and a control electrode coupled to receive a corresponding one of said address signals; and first, second and third serially connected NMOS transistor disposed between said output node and said second terminal and each having a control electrode connected to a corresponding one of the control electrodes of said third, fourth and fifth PMOS transistors via an inverter.

4. The semiconductor memory device as claimed in claim 1, further comprised of said gating means being disposed between said memory cell array and a sense amplifier to provide said second voltage to the selected memory cells in response to a block select signal.

5. The semiconductor memory device as claimed in claim 1, further comprising equalizing means for equalizing a potential difference between the bit lines during the transfer of data exhibiting the amplitude at said second voltage.

6. The semiconductor memory device as claimed in claim 5, wherein said clock signal generator means further comprises:

a second pair of inverters each connected to said first terminal and coupled to receive said predetermined voltage; and a second pair of serially connected transistors disposed between said first terminal and said second terminal, and coupled to receive said predetermined voltage via said second pair of inverters, respectively, for generating an equalization signal having said second voltage to said equalizing means to equalize the potential difference between the bit lines.

7. A semiconductor memory device, comprising:

a first memory cell array;

a second memory cell array separated from said first memory cell array;

a first bit line pair for accessing selected memory cells of said first memory cell array with data exhibiting first logic states at a first voltage;

a second bit line pair for accessing selected memory cells of said second memory cell array with data exhibiting said first logic states at said first voltage;

an equalizing circuit for equalizing potential differences between bit lines comprising said first bit line pair and for equalizing potential differences between bit lines comprising said second bit line pair;

a first separation gate exhibiting a threshold voltage, and connecting said first bit line pair to a first sense amplifier in response to a first clock signal;

a second separation gate exhibiting said threshold voltage, and connecting said second bit line pair to a second sense amplifier in response to a second clock signal; and supply means coupled to receive a second voltage exhibiting an amplitude differing from said first voltage by not less than said threshold voltage, for selectively providing said first clock signal with an amplitude equal to said second voltage to said first separation gate for enabling said first bit line pair to access the selected memory cells of said first memory cell array, and for providing said second clock signal with an amplitude equal to said second voltage to said second separation gate for enabling said second bit line pair to access the selected memory cells of said second memory cell array, in dependence upon a block select signal.

8. The semiconductor memory device as claimed in claim 7, wherein said first voltage is not greater than 3.3 volts, and said second voltage is greater than said first voltage by at least said threshold voltage.

9. The semiconductor memory device as claimed in claim 7, wherein said supply means comprises:

driver means for generating an intermediate signal having said second voltage in response to address signals;

first and second inverters each coupled to receive said intermediate signal, for providing first and second inverted signals; and a serially connected pair of first and second transistors disposed between a high voltage terminal and a reference voltage terminal, for receiving said first and second inverted signals, respectively, for alternately providing said first clock signal with the amplitude equal to said second voltage to said first separation gate to enable said first bit line pair to access the selected memory cells of said first memory cell array, and for providing said second clock signal with the amplitude equal to said second voltage to said second separation gate to enable said second bit line pair to access the selected memory cells of said second memory cell array.

10. The semiconductor memory device as claimed in claim 9, further comprising:
equalizing signal driving means for generating an equalization signal to said equalizing circuit at said first voltage in response to said intermediate signal.

11. A semiconductor memory device, comprising:
a memory cell array comprising a plurality of memory cells;
a plurality of bit line pairs conducting data exhibiting a first logic state having a first amplitude;
equalizing means for equalizing potential differences between the bit line pairs;
sense amplifying means for sensing data conducted by said bit line pairs;
isolation means exhibiting a threshold voltage drop, for selectively isolating said bit line pairs from said sense amplifying means in dependence upon isolation signals; and
means for providing, in response to an address signal, said isolation means with the isolation signals at a first voltage having a second amplitude differing from said first amplitude by not less than said threshold voltage, and for providing said equalizing means with a second voltage having said first amplitude, said providing means comprising:
driver means for generating an intermediate signal having said second amplitude in response to address signals;
first and second inverters each coupled to receive said intermediate signal, for providing first and second inverted signals; and
a first serially connected pair of transistors disposed between a high voltage terminal and a reference voltage terminal, for receiving said first and second inverted signals, respectively, and for providing said isolation signals at said first voltage having said second amplitude to said isolation means for enabling the bit line pairs to transfer said data into selected memory cells of said memory cell array;
third and fourth inverters each coupled to receive said intermediate signal, for providing third and fourth inverted signal; and
a second serially connected pair of transistors disposed between said high voltage terminal and said reference voltage terminal, for receiving said third and fourth inverted signals, respectively, and for providing said second voltage having said first amplitude to said equalizing means for equalizing the potential differences between the bit line pairs.

12. The semiconductor memory device as claimed in claim 11, further comprised of said second voltage being not greater than 3.3 volts.

13. A semiconductor memory device, comprising:
a first memory cell array;
a first bit line pair for accessing said first memory cell array with data having a first a first logic state having a first amplitude;
first separation gate means exhibiting a threshold voltage, for connecting said first bit line pair to said first memory cell array in response to a first separation clock signal; and
first clock driver means coupled to receive a first voltage having a second amplitude differing in value from said first amplitude by not less than said threshold voltage, for generating said first separation dock signal at said second amplitude, said first clock driver means comprising:
driver means for generating an intermediate signal having said second amplitude in response to address signals;
first and second inverters each coupled to receive said intermediate signal, for providing first and second inverted signals; and
a serially connected pair of first and second transistors disposed between a high voltage terminal and a reference voltage terminal, for receiving said first and second inverted signals, respectively, and for providing said first separation clock signal at said first voltage having said second amplitude to said first separation gate means for enabling the first bit line pair to transfer said data exhibiting said first logic state having said first amplitude into selected memory cells of said first memory cell array.

14. The semiconductor memory device as claimed in claim 13, further comprised of said first separation gate means comprising a pair of MOS transistors exhibiting said threshold voltage.

15. The semiconductor memory device as claimed in claim 14, further comprised of means for generating said first voltage by charge pumping.

16. The semiconductor memory device as claimed in claim 13, further comprising:
a second memory cell array;
a second bit line pair for accessing said second memory cell array with said data;
second separation gate means exhibiting said threshold voltage, for connecting said second bit line pair to said second memory cell array in response to a second separation clock signal; and
said first clock driver means alternately generating said second separation clock signal at said second amplitude to said second separation gate means for enabling the second bit line pair to transfer said data exhibiting said first logic state having said first amplitude into selected memory cells of said second memory cell array.

17. The semiconductor memory device as claimed in claim 16, further comprising an input/output stage coupled between said first bit line pair and said second bit line pair.

18. The semiconductor memory device as claimed in claim 13, further comprised of said first amplitude being not greater than 3.3 volts.

19. The semiconductor memory device as claimed in claim 16, further comprising:
means for responding to an equalization signal by equalizing potential differences between bit lines in said first bit line pair, and by equalizing potential differences between bit lines in said second bit line pair; and
equalizing signal driving means for generating said equalization signal at said first amplitude in response to said intermediate signal.

20. A semiconductor memory device, comprising:
a first memory cell array;
a second memory cell array;
a first bit line pair for accessing said first memory cell array with data having a first logic state at a first voltage;
a second bit line pair for accessing said second memory cell array with data having said first logic state at said first voltage;

first sense amplifier means for amplifying and providing the data on said first bit line pair;

second sense amplifier means for amplifying and providing the data on said second bit line pair;

first separation gate means exhibiting a threshold voltage, for connecting said first bit line pair to said first sense amplifier means in response to a first separation clock signal;

second separation gate means exhibiting said threshold voltage, for connecting said second bit line pair to said second sense amplifier means in response to a second separation clock signal; and bit line separation clock driver means coupled to receive a second voltage differing in amplitude from said first voltage by said threshold voltage, for generating said first separation clock signal at said second voltage to said first separation gate means for enabling said first bit line pair to access selected memory cells of said first memory cell array, and said second separation clock signal at said second voltage to said second separation gate means for enabling said second bit line pair to access selected memory cells of said second memory cell array; and an input/output gate coupled between said first sense amplifier means and said second amplifier means.

21. The semiconductor memory device as claimed in claim 20, wherein said bit line separation clock driver means comprises:

driver means for generating an intermediate signal in response to address signals;

first and second inverters each coupled to receive said intermediate signal, for providing first and second inverted signals; and a first serially connected pair of transistors disposed between a high voltage terminal and a reference voltage terminal, for receiving said first and second inverted signals, respectively, and for generating said first separation clock signal at said second voltage to said first separation gate means to enable said first bit line pair to transfer said data to the selected memory cells of said first memory cell array;

third and fourth inverters each coupled to receive said intermediate signal, for providing third and fourth inverted signals; and a second serially connected pair of transistors disposed between said high voltage terminal and said reference voltage terminal, for receiving said third and fourth inverted signals, respectively, and for generating said second separation clock signal at said second voltage to said second separation gate means for enabling the second bit line pair to transfer said data into the selected memory cells of said second memory cell array.

22. The semiconductor memory device as claimed in claim 20, wherein said bit line separation clock driver means comprises a pair of serially connected inverters driven by said second voltage.

* * * * *